United States Patent
Chiou et al.

(10) Patent No.: US 7,862,355 B2
(45) Date of Patent: Jan. 4, 2011

(54) REPAIR DEVICE FOR PRINTED CIRCUIT BOARD

(75) Inventors: Chui-Hsin Chiou, Taipei Hsien (TW); Guo-Hong Huang, Taipei Hsien (TW); Chia-Hua Chang, Taipei Hsien (TW); Chau-Lin Chang, Taipei Hsien (TW); Han-Chieh Chang, Taipei Hsien (TW)

(73) Assignees: Foxnum Technology Co., Ltd., Tucheng, Taipei County (TW); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 515 days.

(21) Appl. No.: 11/967,035

(22) Filed: Dec. 29, 2007

(65) Prior Publication Data

US 2009/0139745 A1    Jun. 4, 2009

(30) Foreign Application Priority Data

Nov. 29, 2007    (CN)    .................... 2007 1 0202780

(51) Int. Cl.
*H01R 29/00* (2006.01)

(52) U.S. Cl. ..................................... 439/189

(58) Field of Classification Search ............... 439/189, 439/510, 511
See application file for complete search history.

(56) References Cited

U.S. PATENT DOCUMENTS

| | | | | |
|---|---|---|---|---|
| 3,327,174 A * | 6/1967 | Barre et al. | ................. | 361/744 |
| 3,354,355 A * | 11/1967 | Cliffgard et al. | ............. | 361/781 |
| 3,581,268 A * | 5/1971 | Akst | ........................... | 439/507 |
| 3,609,462 A * | 9/1971 | De Barros | ................... | 361/796 |
| 3,660,728 A * | 5/1972 | Carter | ........................ | 361/789 |
| 3,950,058 A * | 4/1976 | Cronin | ........................ | 439/51 |
| 4,026,620 A * | 5/1977 | Lieberman | .................. | 439/189 |
| 4,047,781 A * | 9/1977 | DeNigris et al. | .............. | 439/78 |
| 4,085,434 A * | 4/1978 | Stevens | ...................... | 361/796 |
| 4,257,029 A * | 3/1981 | Stevens | ...................... | 340/915 |
| 4,384,755 A * | 5/1983 | Perretta | ...................... | 439/189 |
| 4,488,201 A * | 12/1984 | Webb et al. | ................. | 361/626 |
| 4,542,372 A * | 9/1985 | Takach, Jr. | .................. | 340/500 |
| 4,830,621 A * | 5/1989 | Maue et al. | .................... | 439/52 |
| 4,869,677 A * | 9/1989 | Johnson et al. | ............... | 439/80 |
| 4,898,547 A * | 2/1990 | Bottoms et al. | ............. | 439/652 |
| 5,130,893 A * | 7/1992 | Straate et al. | ............... | 361/728 |
| 5,381,050 A * | 1/1995 | Siclari et al. | ................ | 307/112 |
| 5,383,787 A * | 1/1995 | Switky et al. | ................. | 439/67 |
| 5,402,008 A * | 3/1995 | St. John | ....................... | 307/64 |
| 5,442,170 A * | 8/1995 | Kreft et al. | .................. | 250/229 |
| 5,508,860 A * | 4/1996 | Takagi et al. | ............. | 360/97.01 |

(Continued)

*Primary Examiner*—Neil Abrams
(74) *Attorney, Agent, or Firm*—Frank R. Niranjan

(57) ABSTRACT

A repair device for a PCB includes a clamp portion having a plurality of receptacles defined therein, a connector head having a plurality of contacts configured to connect with the PCB, a plurality of conductive lines arranged side by side, and a lead wire. One end of each of the conductive lines is connected to the clamp portion and exposed to outside of the clamp portion via a corresponding receptacle of the clamp portion, the other end of each of the conductive lines is connected to a corresponding contact of the connector head. Two ends of the lead wire are electrically connected to two of the conductive lines via the corresponding receptacles, thereby switching signal transmission from one of the input terminals of the PCB to another input terminal of the PCB.

1 Claim, 1 Drawing Sheet

U.S. PATENT DOCUMENTS 6,428,327 B1 * 8/2002 Tamarkin et al. .............. 439/67
6,469,261 B2 * 10/2002 Yamanashi et al. .......... 174/268
6,972,975 B2 * 12/2005 Su ............................. 363/146

* cited by examiner

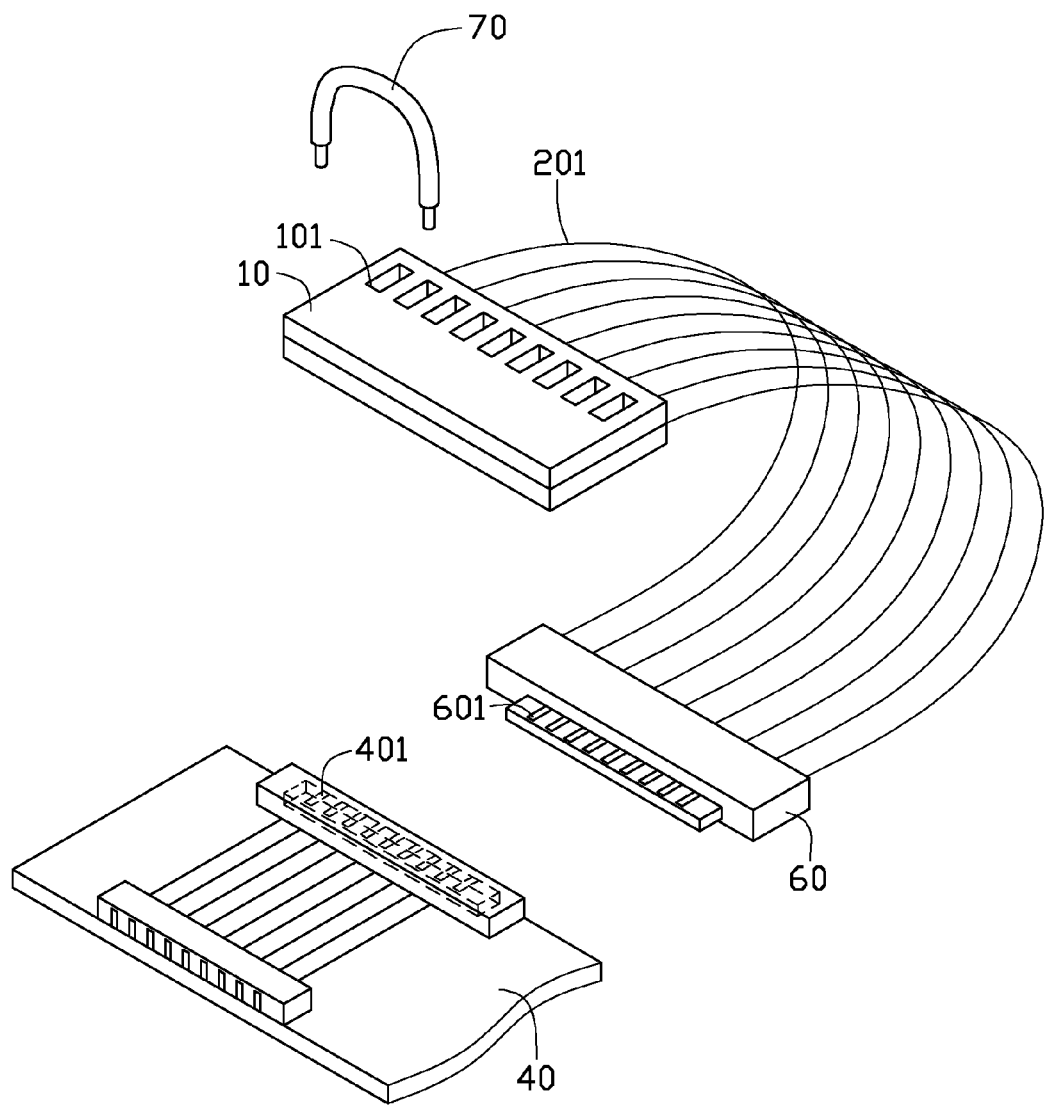

REPAIR DEVICE FOR PRINTED CIRCUIT BOARD

BACKGROUND

1. Field of the Invention

The present invention relates to a repair device for a printed circuit board.

2. Description of Related Art

Advancements in the electronics industry have brought ever smaller printed circuit boards (PCB) with increasing numbers of components. As a result, a PCB with a limited area requires disposing denser transmission lines thereon. Therefore, the probability of the transmission lines having defects increases. Once a fault or defect is found, then it has to be located and repaired. Most of the methods presently under use require that the fault or defect be visually located by the operator, and then the defective conductor line is repaired, and if the transmission lines of the PCB become inoperable, the signal transmission will be stopped and then a change for a new printed circuit board may be needed.

What is needed is a repair device for a printed circuit board to maintain signal transmission when the transmission lines of the printed circuit board become inoperable.

SUMMARY

An exemplary repair device for a printed circuit board (PCB) includes a clamp portion having a plurality of receptacles defined therein, a connector head having a plurality of contacts configured to connect with the PCB, a plurality of conductive lines arranged side by side, and a lead wire. One end of each of the conductive lines is clamped by the clamp portion and exposed to outside of the clamp portion via a corresponding receptacle of the clamp portion, the other end of each of the conductive lines is connected to a corresponding contact of the connector head. Two ends of the lead wire are electrically connected to two of the conductive lines via the corresponding receptacles, thereby switching signal transmission from one of the input terminal of the PCB to another input terminal of the PCB.

Other advantages and novel features of the present invention will become more apparent from the following detailed description of preferred embodiment when taken in conjunction with the accompanying drawing, in which:

BRIEF DESCRIPTION OF THE DRAWINGS

The drawing is a circuit diagram of a repair device for printed circuit board in accordance with an embodiment of the present invention.

DETAILED DESCRIPTION

Referring to the drawing, a repair device for a printed circuit board (PCB) 40 in accordance with an embodiment of the present invention includes a plurality of conductive lines 201 arranged side by side, a clamp portion 10 having a plurality of receptacles 101 respectively corresponding to the conductive lines 201, and a connector head 60 having a plurality of contacts 601 configured to connect to the PCB 40. The PCB 40 having a plurality of input terminals 401 and a plurality of output terminals connected to the input terminals 401 via a plurality of transmission lines respectively. The input terminals 401 can respectively connect to the contacts 601, and then electrically connect to an end of a corresponding conductive line respectively. The other end of each of the conductive lines 201 is clamped by the clamp portion 10. Therefore, when two ends of a lead wire 70 outside the clamp portion 10 are plugged into any two of the receptacles 101, two corresponding lines of the lines 201 are electrically connected.

In this embodiment, the conductive lines 201 form a flexible cable, and the end of each of the conductive lines 201 clamped by the clamp portion 10 is exposed to outside of the clamp portion via a corresponding receptacle of the clamp portion.

When any transmission line between the input terminals 401 and the corresponding output terminals becomes inoperable, an operator can utilize an idle transmission line to transmit signals instead of the inoperable transmission line. For example, if the one transmission line between one of the input terminals 401 and the corresponding output terminal becomes inoperable, an operator then plug one end of the lead wire 70 into one of the receptacles 102 which is corresponding to the input terminal connected to the inoperable transmission line, and plug the other end of the lead wire 70 into another receptacle which is corresponding to an idle input terminal of the input terminals 401, to make the signals on the input terminal connected to the inoperable transmission line switch to the idle input terminal and be transmitted via the transmission line between the idle input terminal and the corresponding output terminal instead.

The foregoing description of the exemplary embodiments of the invention has been presented only for the purposes of illustration and description and is not intended to be exhaustive or to limit the invention to the precise forms disclosed. Many modifications and variations are possible in light of the above teaching. The embodiments were chosen and described in order to explain the principles of the invention and their practical application so as to enable others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. A repair device comprising:
   a printed circuit board (PCB) having a plurality of input terminals;
   a clamp portion having a plurality of receptacles defined therein;
   a connector head having a plurality of contacts configured to connect with the input terminals of the PCB correspondingly;
   a plurality of conductive lines arranged side by side, one end of each of the conductive lines being connected to the clamp portion and exposed to outside of the clamp portion via a corresponding receptacle of the clamp portion, the other end of each of the conductive lines connected to a corresponding contact of the connector head; and
   a lead wire with two ends electrically connected to two of the conductive lines via the corresponding receptacles, thereby switching signal transmission from one of the input terminals of the PCB to another input terminal of the PCB,
   wherein the conductive lines form a flexible cable.

* * * * *